(12) United States Patent
Zhu

(10) Patent No.: US 11,335,217 B2
(45) Date of Patent: May 17, 2022

(54) DISPLAY DEVICE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Cuilin Zhu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 172 days.

(21) Appl. No.: 16/760,987

(22) PCT Filed: Apr. 21, 2020

(86) PCT No.: PCT/CN2020/085968
§ 371 (c)(1),
(2) Date: May 1, 2020

(87) PCT Pub. No.: WO2021/036296
PCT Pub. Date: Mar. 4, 2021

(65) Prior Publication Data
US 2021/0407338 A1    Dec. 30, 2021

(30) Foreign Application Priority Data

Aug. 30, 2019 (CN) .......................... 201910811218.8

(51) Int. Cl.
*G09F 9/30* (2006.01)
*H01L 51/52* (2006.01)
*H01L 51/56* (2006.01)

(52) U.S. Cl.
CPC ............ *G09F 9/301* (2013.01); *H01L 51/529* (2013.01); *H01L 51/56* (2013.01); *H01L 2251/5338* (2013.01)

(58) Field of Classification Search
CPC ....... G09F 9/301; G06F 1/1652; H01L 51/56; H01L 51/529; H01L 2251/5338
See application file for complete search history.

(56) References Cited

U.S. PATENT DOCUMENTS

| 9,627,463 | B2* | 4/2017 | Kwon | ................. | H01L 27/3276 |
| 10,462,896 | B1* | 10/2019 | Kwon | ................. | H01L 51/5253 |

(Continued)

FOREIGN PATENT DOCUMENTS

| CN | 106710451 A | 5/2017 |
| CN | 107425036 A | 12/2017 |

(Continued)

*Primary Examiner* — Joe H Cheng

(57) ABSTRACT

A display device and a method for manufacturing a display device is provided. The display device includes a display panel. The display panel includes a bending portion, a first non-bending portion and a second non-bending portion, positioned at two opposite sides of the bending portion. The second non-bending portion is positioned by bending the bending portion in an asymmetric and non-180 degree way toward a back side of the first non-bending portion. The present disclosure solves the issues of the conventional art, which cannot narrow down the width of the side frame.

8 Claims, 5 Drawing Sheets

(56) References Cited

U.S. PATENT DOCUMENTS

| | | | |
|---|---|---|---|
| 10,873,043 B2* | 12/2020 | Jin | G06F 3/0445 |
| 2015/0382446 A1* | 12/2015 | Kwon | H01L 27/3276 |
| | | | 174/251 |
| 2016/0172428 A1* | 6/2016 | Song | H01L 27/3276 |
| | | | 257/99 |
| 2017/0338294 A1* | 11/2017 | Choi | H01L 51/0097 |
| 2018/0007789 A1* | 1/2018 | Kawata | H01L 27/3244 |
| 2018/0059728 A1* | 3/2018 | Kim | H01L 51/0097 |
| 2018/0123060 A1* | 5/2018 | Jang | H01L 27/1218 |
| 2018/0182838 A1* | 6/2018 | Yeo | H01L 27/3288 |
| 2019/0165332 A1* | 5/2019 | Kwon | H01L 51/525 |
| 2019/0281692 A1* | 9/2019 | Jeon | H01L 51/0097 |
| 2019/0333982 A1 | 10/2019 | Choi et al. | |
| 2019/0377447 A1* | 12/2019 | Lee | G06F 1/1643 |
| 2020/0120807 A1* | 4/2020 | Park | G06F 3/0443 |
| 2020/0253035 A1 | 8/2020 | Kwon et al. | |
| 2021/0280093 A1* | 9/2021 | Zhu | G06F 3/0412 |

FOREIGN PATENT DOCUMENTS

| | | | |
|---|---|---|---|
| CN | 109065589 A | | 12/2018 |
| CN | 109272874 A | | 1/2019 |
| CN | 109637363 A | * | 4/2019 |
| CN | 109637363 A | | 4/2019 |
| CN | 110728907 A | | 1/2020 |

\* cited by examiner

| A display panel is provided. The display panel comprises: a bending portion, a first non-bending portion and a second non-bending portion. The first non-bending portion and the second non-bending portion are respectively positioned at two opposite sides of the bending potion. | ⌒ S100 |

↓

| The bending portion is bent in an asymmetric and non-180 degree way toward a back side of the first non-bending portion to position the second non-bending portion. | ⌒ S200 |

Fig. 5

DISPLAY DEVICE AND MANUFACTURING METHOD THEREOF

This application is a National Stage of PCT/CN2020/085968, filed Apr. 21, 2020, which under 35 U.S.C. § 119 claims the benefit of and priority to Chinese Patent Application No. 201910811218.8, filed Aug. 30, 2019, the entireties of which are hereby incorporated herein by reference.

FIELD OF THE INVENTION

The present invention relates to a display technique, and more particularly, to a display device and a manufacturing method thereof.

BACKGROUND

In the communication field, the demands for cell phones, Televisions, tablets, laptops, and digital cameras become greater. More and more flexible display panels are adopted in these devices. In the manufacturing process of the flexible display panel, the driver ICs needs to be bended to the back of the display panel to shrink the width of the side frame or the down border such that the full screen display could be realized.

As shown in FIG. 1, the conventional display device 2000 has a bending design, which symmetrically bends the device 2000 from the center of the bending portion 110. That is, the display device 2000 is bended 180 degrees. This design could well balance the force applied to the bended conducting wire 150. However, this design also limits the width of the side frame W. For those devices requiring a narrow side frame (or narrow down border), this design cannot meet such demands. Therefore, a novel design is required to solve the above issue. KWSW,

SUMMARY

One objective of an embodiment of the present invention is to provide a display and a related manufacturing method, to solve the above-mentioned issue of shrinking the width of side frame.

According to an embodiment of the present invention, a display device is disclosed. The display device comprises a display panel. The display panel comprises: a bending portion; and a first non-bending portion and a second non-bending portion, respectively positioned at two opposite sides of the bending portion, the second non-bending portion is positioned by bending the bending portion in an asymmetric and non-180 degree way toward a back side of the first non-bending portion.

In the display device, the asymmetric and non-180 degree way comprises: bending the second non-bending portion along a curve toward the back side of the first non-bending portion. The curve is a line segment defined by a top surface of the bending portion in a sectional drawing and the curve orderly has bending radiuses R1, R2, R3 . . . and Rn in a direction that the first non-bending portion extends to the second non-bending portion; n is larger than 2; and R1<R2<R3< . . . <Rn.

In the display device, the display device further comprises a first back plate, fixed on a bottom surface of the first non-bending portion; a second back plate, fixed on a bottom surface of the second non-bending portion; a heat dissipation material, fixed on a bottom surface of the first back plate; and a stiffener, sandwiched between the heat dissipation material and the second back plate.

In the display device, the heat dissipation material is manufactured with a composite material comprising at least one of copper, graphite, and foam.

In the display device, the stiffener is manufactured with polyethylene terephthalate (PET) or cycloolefine polymer.

In the display device, the display device further comprises: a filler, touching the first back plate, the heat dissipation material and the stiffener, the filler protrudes from an edge of the first back plate and pushes against the bending portion.

In the display device, the filler is manufactured with rubber, silicone, UV-curable resin, or metal.

According to the method, the asymmetric and non-180 degree way comprises: bending the second non-bending portion along a curve toward the back side of the first non-bending portion. The curve is a line segment defined by a top surface of the bending portion in a sectional drawing and the curve orderly has bending radiuses R1, R2, R3 . . . and Rn in a direction that the first non-bending portion extends to the second non-bending portion; n is larger than 2; and R1<R2<R3< . . . <Rn.

According to the method, the method further comprises: filling a filler into a place underneath the first non-bending portion. The filler protrudes from an edge of the first non-bending portion.

According to an embodiment of the present invention, a method for manufacturing a display device is disclosed. The method comprises: providing a display panel, wherein the display panel comprises: a bending portion; and a first non-bending portion and a second non-bending portion, respectively positioned at two opposite sides of the bending portion; and bending the bending portion in an asymmetric and non-180 degree way toward a back side of the first non-bending portion to position the second non-bending portion.

In contrast to the conventional art, an embodiment of the present invention provides a display device and a manufacturing method. It bends the display device in an asymmetric and non-180 degree way such that the display device could have a narrower side frame. This solve the issues of the conventional art, which cannot narrow down the width of the side frame.

These and other features, aspects and advantages of the present disclosure will become understood with reference to the following description, appended claims and accompanying figures.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

FIG. 5 is a flow chart of a method for manufacturing the display device according to an embodiment of the present invention.

DETAILED DESCRIPTION OF PREFERRED EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
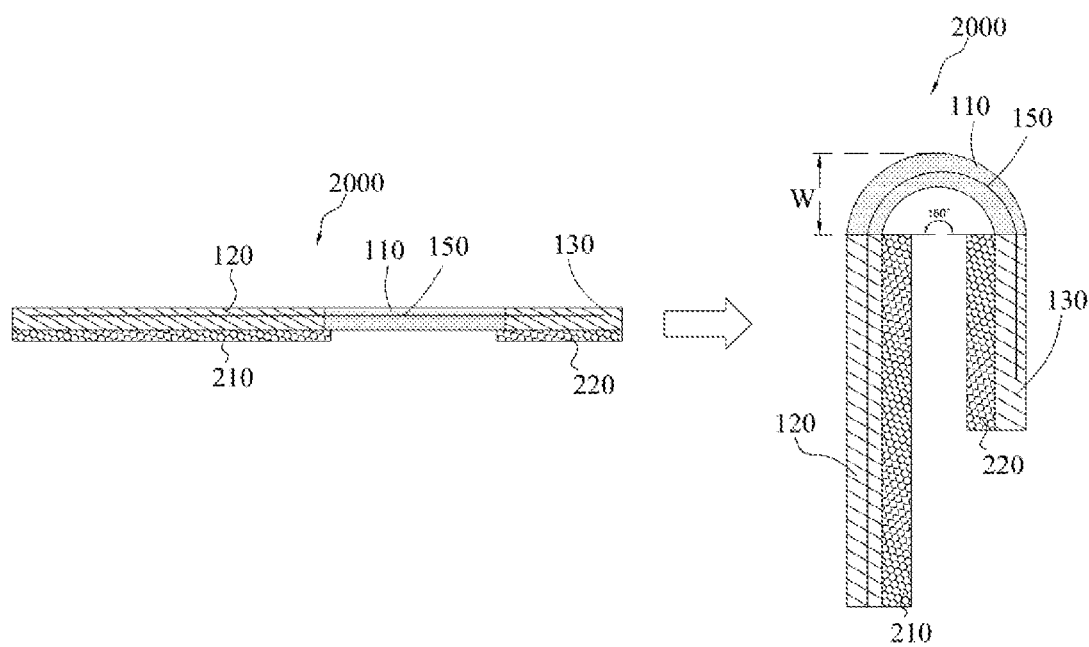
FIG. 1 is a diagram of a bending design of a display panel according to the conventional art.
Figure 2:
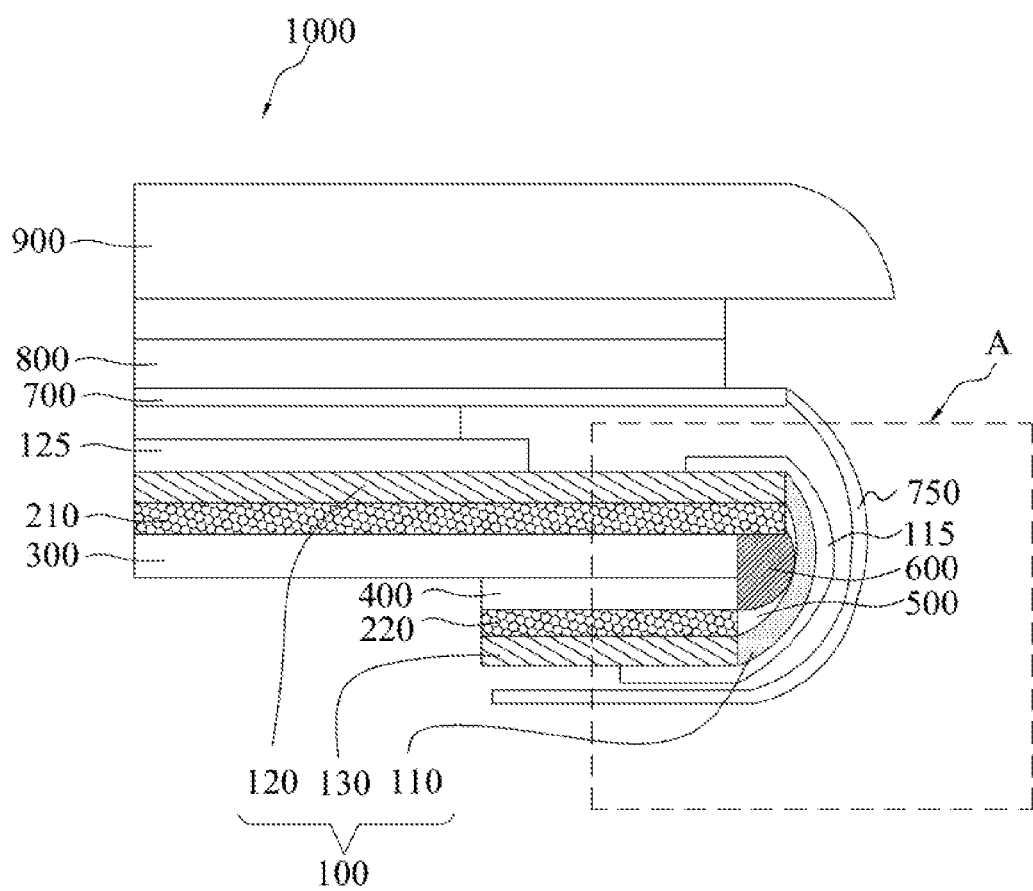
FIG. 2 is a side view of a cross-section of a display device according to an embodiment of the present invention.
Figure 3:
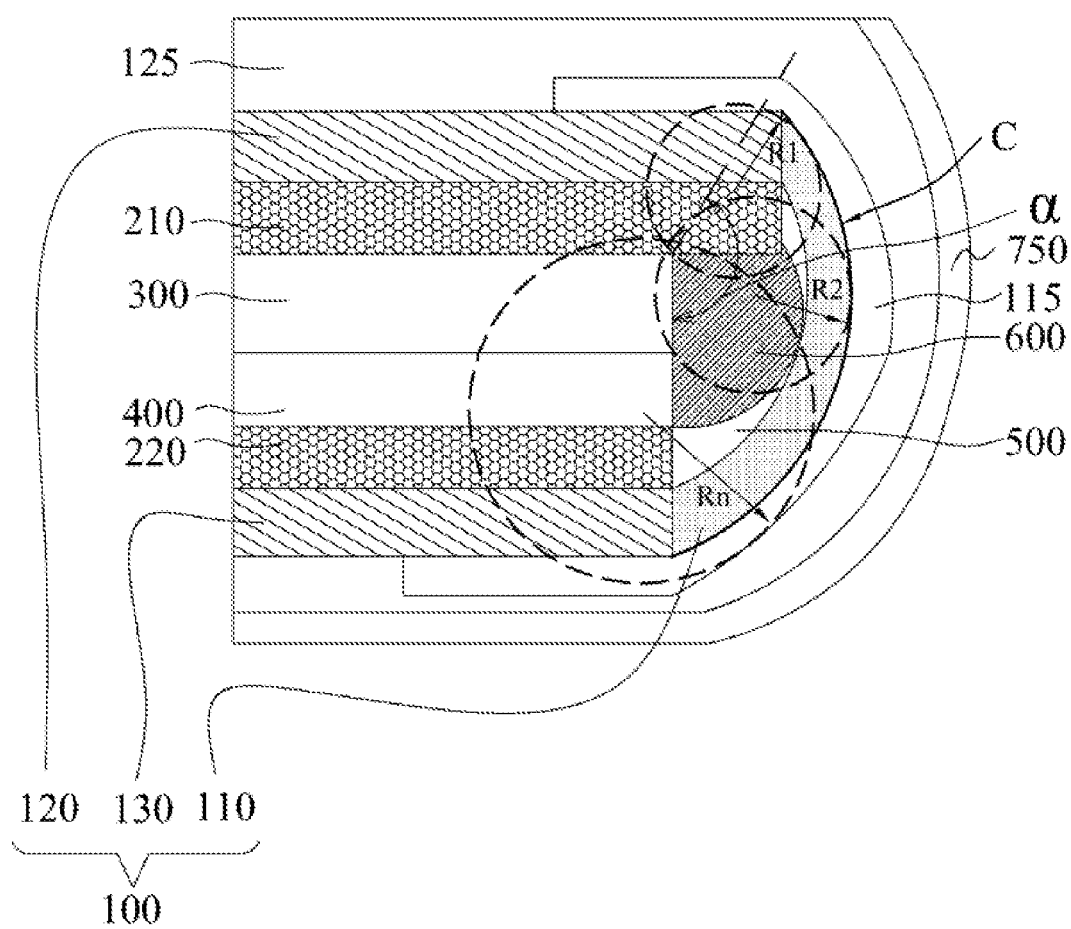
FIG. 3 is a scale-up diagram of the area A shown in FIG. 2.

Please refer to FIG. 2 in conjunction with FIG. 3. FIG. 2 is a side view of a cross-section of a display device according to an embodiment of the present invention. FIG. 3 is a scale-up diagram of the area A shown in FIG. 2.

The display device 1000 comprises a display panel 100. The display panel 100 comprises a bending portion 110, a first non-bending portion 120 and a second non-bending portion 130. The first non-bending portion 120 and the second non-bending portion 130 are respectively positioned at two opposite sides of the bending portion. The second non-bending portion 130 is positioned by asymmetrically bending the bending portion 110 α degree (in an asymmetric and non-180 degree way) toward a back side of the first non-bending portion 120.

Because the display panel 100 is bended, the display panel should be flexible. In a preferred embodiment, the display panel 100 is a flexible OLED display panel. However, this is not a limitation of the present invention.

The first non-bending portion 120 is the display area of the display panel 100. The second non-bending portion 130 is the peripheral area of the display panel 100. The peripheral area of the display panel 100 comprises driver ICs to drive the TFT matrix in the display area. Through bending the area of driver ICs to the back of the display panel 100, the width of the side frame or down border of the display device 1000 could be reduced. Therefore, the above bending design could be used in a full-screen display device.

Specifically, the asymmetric and non-180 degree way is to bend the second non-bending portion 130 along the curve C toward the back side of the first non-bending portion 120. The curve C is a line segment defined by the top surface of the bending portion 110 in the sectional view of FIG. 3. The curve C orderly has bending radiuses R1, R2, R3 . . . and Rn in a direction that the first non-bending portion 120 extends to the second non-bending portion 130. The number n is larger than 2. Furthermore, the relationship among the bending radiuses is R1<R2<R3< . . . <Rn.

As shown in FIG. 3, the angle α is less than 180 degrees. After bending, the top surface of the second non-bending portion 130 is parallel to the top surface of the first non-bending portion 120. Therefore, after the display device 1000 is asymmetrically bended α degrees, the top surface of the bending portion 110 is a curve having increasing bending radiuses in the sectional view of FIG. 3. In comparison, the conventional art, the top surface of the bending portion is a half round.

Figure 4A:
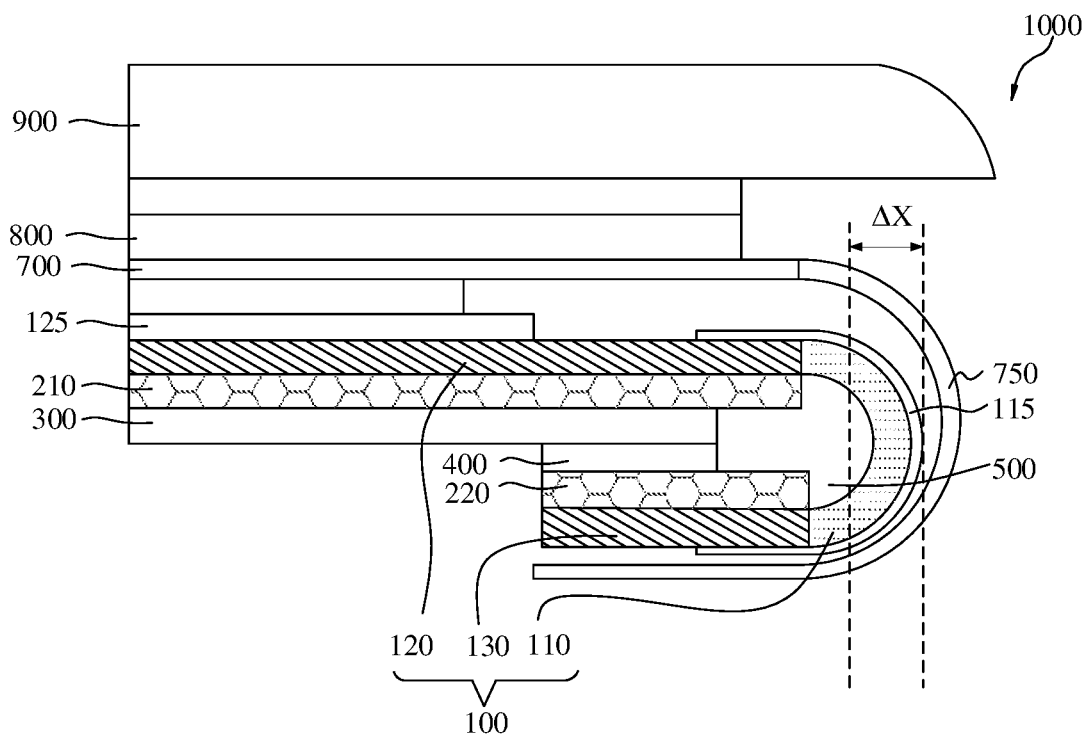
FIG. 4A is a diagram showing a structure of the display device after being symmetrically bended 180 degree.
Figure 4B:
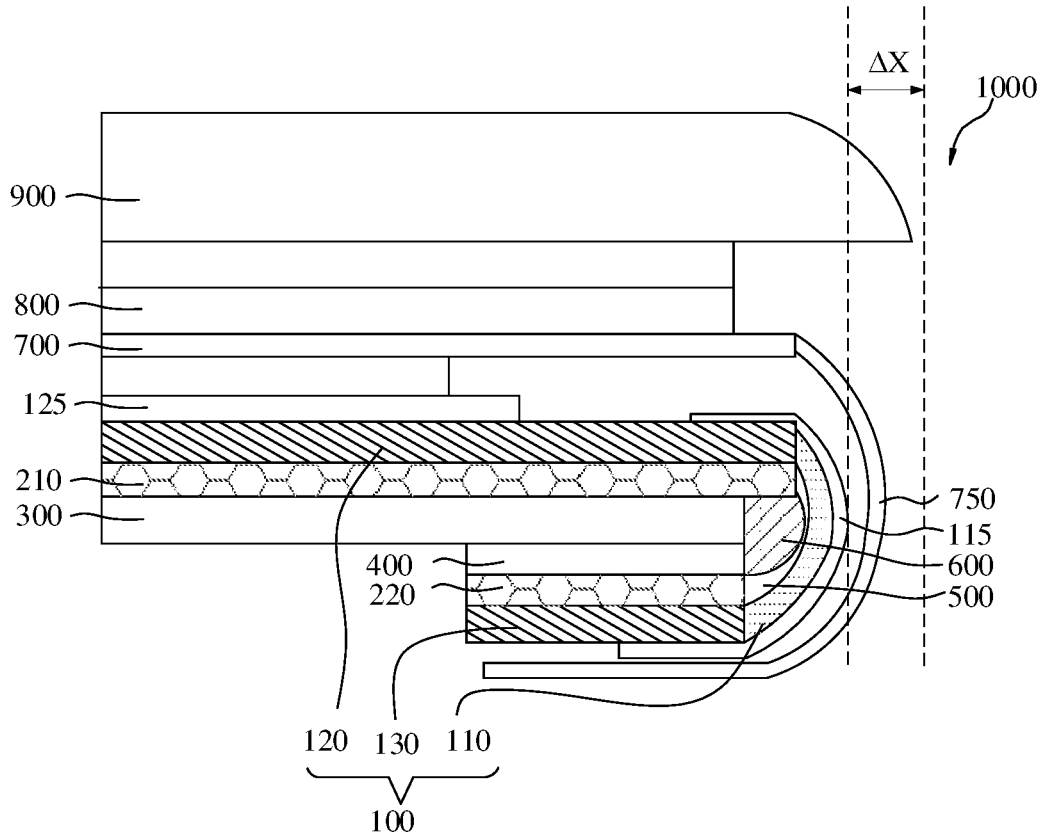
FIG. 4B is a diagram showing a structure of the display device after being bended in an asymmetric and non-180 degree way.

Please refer to FIG. 4A and FIG. 4B. FIG. 4A is a diagram showing a structure of the display device after being symmetrically bended 180 degree. FIG. 4B is a diagram showing a structure of the display device after being bended in the asymmetric and non-180 degree way. By comparing FIG. 4A with FIG. 4B, the width of side frame could be further reduced by ΔX if the device is asymmetrically bended non-180 degrees.

The display device 1000 comprises a first back plate 210, a second back plate 220, a heat dissipation material 300, and a stiffener 400. The first back plate 210 is fixed on the bottom surface of the first non-bending portion 120. The second back plate 220 is fixed on the bottom surface of the second non-bending portion 130. The heat dissipation material 300 is fixed on the bottom surface of the first back plate 210. The stiffener 400 is sandwiched between the heat dissipation material 300 and the second back plate 220.

The heat dissipation material 300 is manufactured with a composite material comprising at least one of copper, graphite, and foam. The stiffener 400 is manufactured with polyethylene terephthalate (PET) or cycloolefine polymer. The stiffener 400 is used to reinforce the structure strength of the display device 1000.

As shown in FIG. 3, the first non-bending portion 120, the bending portion 110, the second non-bending portion 130, the first back plate 210, the heat dissipation material 300, the stiffener 400 and the second back plate 220 defines a space 500. A filler 600 is filled in the space 500. The filler 600 touches the first back plate 210, the heat dissipation material 300 and the stiffener 400. The filler 600 is manufactured with rubber, silicone, UV-curable resin, or metal. The filler 600 could further increase the structure characteristic (such as increasing the structure strength or the ability of absorbing/buffering external forces) near the space 500 such that the structure near the space 500 is not deformed due to external forces.

Please note, this is not a limitation of the present invention. The space 500 could have no filler in it. However, if the filler 600 is filled in the space 500, because the filler 600 protrudes from an edge of the first back plate 210 or the first non-bending portion, the filler 600 could push against the bending portion 110 when the bending portion 110 is being pended. Furthermore, the length of the protrusion of the filler 600 protruded from the non-bending portion 120 or the first back plate 210 could be adjusted through controlling the material or the amount of the filler 600 such that the bending radiuses R1, R2, R3 . . . and Rn of the bending portion 110 could be adjusted accordingly. In other words, if the length of the protrusion of the filler 600 is longer, then the bending radiuses R1, R2, R3 . . . and Rn of the bending portion 110 become larger as well. Therefore, the bending radiuses R1, R2, R3 . . . and Rn of the bending portion 110 could be controlled to achieve the asymmetric and non-180 degree bending through the arrangement of the protrusion of the filler 600 protruded from the non-bending portion 120 or the first back plate 210.

Furthermore, a UV curing resin 115 could be formed on the top surface of the display panel 100 to cover at least the top surface of the bending portion 110. This could prevent the moisture from entering the display panel 110 and could also protect the bending portion from being scratched.

The display device 1000 could further comprise a thin film packaging layer 125, a touch panel 700, a flexible printed circuit board 750, a polarizer 800 and a glass cover 900, positioned on the display panel 100.

In addition, a method for manufacturing the display device is disclosed. Please refer to FIG. 5. FIG. 5 is a flow chart of the method for manufacturing the display device 1000 according to an embodiment of the present invention.

The method comprises following steps:

Step S100: providing a display panel 1000. The display panel 1000 comprises: a bending portion 110, a first non-bending portion 120 and a second non-bending portion 130. The first non-bending portion 120 and the second non-bending portion 130 are respectively positioned at two opposite sides of the bending portion.

In an embodiment, the first non-bending portion 120 is the display area of the display panel 100. The second non-bending portion 130 is the peripheral area of the display panel 100. The peripheral area of the display panel 100 comprises driver ICs to drive the TFT matrix in the display area. Through bending the area of driver ICs to the back of the display panel 100, the width of the side frame or down border of the display device 1000 could be reduced. Therefore, the above method could be used to manufacture a full-screen display device.

The method further comprises: S200: bending the bending portion 110 in an asymmetric and non-180 degree way toward a back side of the first non-bending portion 120 to position the second non-bending portion 130.

Specifically, the asymmetric and non-180 degree way is to bend the second non-bending portion 130 along the curve C toward the back side of the first non-bending portion 120. The curve C is a line segment defined by the top surface of the bending portion 110 in the sectional view of FIG. 3. The curve C orderly has bending radiuses R1, R2, R3 ... and Rn in a direction that the first non-bending portion 120 extends to the second non-bending portion 130. The number n is larger than 2. Furthermore, radiuses R1<R2<R3< ... <Rn.

The angle α is less than 180 degrees. After bending, the top surface of the second non-bending portion 130 is parallel to the top surface of the first non-bending portion 120. Therefore, after the display device 1000 is asymmetrically bended α degrees, the top surface of the bending portion 110 is a curve having increasing bending radiuses in the sectional view of FIG. 3. In comparison, the conventional art, the top surface of the bending portion is a half round.

In order to achieve the asymmetric and non-180 degree bending way, a filler 600 could be filled into the space underneath the first non-bending portion 120 such that the filler 600 could protrude from the edge of the first non-bending portion 120. This makes the filler 600 push against the bending portion 110 in the bending process such that the bending radiuses R1<R2<R3< ... <Rn of the bending portion 110 could be adjusted.

Please note, in the above illustration, an embodiment may not be completely illustrated in details. That is because another embodiment already discloses common elements of the embodiment. Therefore, for those not illustrated in details, a person having ordinary skills in the art could refer to the same elements in another embodiment.

In contrast to the conventional art, an embodiment of the present invention provides a display device and a manufacturing method. It bends the display device in an asymmetric and non-180 degree way such that the display device could have a narrower side frame. This solve the issues of the conventional art, which cannot narrow down the width of the side frame.

Above are embodiments of the present invention, which does not limit the scope of the present invention. Any modifications, equivalent replacements or improvements within the spirit and principles of the embodiment described above should be covered by the protected scope of the invention.

What is claimed is:

1. A display device, comprising a display panel, the display panel comprising:
   a bending portion; and
   a first non-bending portion and a second non-bending portion, respectively positioned at two opposite sides of the bending portion, the second non-bending portion is positioned by bending the bending portion along a curve in an asymmetric and non-180 degree way toward a back side of the first non-bending portion;
   wherein the curve is a line segment defined by a top surface of the bending portion in a sectional drawing and the curve orderly has bending radiuses R1, R2, R3 ... and Rn in a direction that the first non-bending portion extends to the second non-bending portion; n is larger than 2; and R1<R2<R3< ... <Rn; and the first non-bending portion is longer than the second non-bending portion.

2. The display device of claim 1, further comprising:
   a first back plate, fixed on a bottom surface of the first non-bending portion;
   a second back plate, fixed on a bottom surface of the second non-bending portion;
   a heat dissipation material, fixed on a bottom surface of the first back plate; and
   a stiffener, sandwiched between the heat dissipation material and the second back plate.

3. The display device of claim 2, wherein the heat dissipation material is manufactured with a composite material comprising at least one of copper, graphite, and foam.

4. The display device of claim 2, wherein the stiffener is manufactured with polyethylene terephthalate (PET) or cycloolefine polymer.

5. The display device of claim 2, further comprising:
   a filler, touching the first back plate, the heat dissipation material and the stiffener, the filler protrudes from an edge of the first back plate and pushes against the bending portion.

6. The display device of claim 5, wherein the filler is manufactured with rubber, silicone, UV-curable resin, or metal.

7. A method for manufacturing a display device, the method comprising:
   providing a display panel, wherein the display panel comprises:
      a bending portion; and
      a first non-bending portion and a second non-bending portion, respectively positioned at two opposite sides of the bending portion; and
   bending the bending portion along a curve in an asymmetric and non-180 degree way toward a back side of the first non-bending portion to position the second non-bending portion;
   wherein the curve is a line segment defined by a top surface of the bending portion in a sectional drawing and the curve orderly has bending radiuses R1, R2, R3 ... and Rn in a direction that the first non-bending portion extends to the second non-bending portion; n is larger than 2; and R1<R2<R3< ... <Rn; and the first non-bending portion is longer than the second non-bending portion.

8. The method of claim 7, further comprising:
   filling a filler into a place underneath the first non-bending portion;
   wherein the filler protrudes from an edge of the first non-bending portion.

* * * * *